United States Patent [19]

Fazlollahi

[11] Patent Number: 4,860,154
[45] Date of Patent: Aug. 22, 1989

[54] DEVICE FOR PROTECTING AN INTEGRATED CIRCUIT AGAINST OVERLOAD AND SHORT CIRCUIT CURRENTS

[75] Inventor: Hossein Fazlollahi, Stockholm, Sweden

[73] Assignee: Telfonaktiebolaget L M Ericsson, Stockholm, Sweden

[21] Appl. No.: 166,053

[22] Filed: Mar. 9, 1988

[30] Foreign Application Priority Data

Apr. 3, 1987 [SE] Sweden ................................ 8701415

[51] Int. Cl.⁴ .............................................. H02H 3/087
[52] U.S. Cl. ...................................... 361/101; 361/93; 330/207 P; 330/298
[58] Field of Search .................... 361/87, 93, 100, 101; 330/207 P, 298; 323/276, 277, 278, 311, 312, 315

[56] References Cited

U.S. PATENT DOCUMENTS

| | | | |
|---|---|---|---|
| 4,321,648 | 3/1982 | Kaplan | 330/207 P X |
| 4,337,494 | 6/1982 | Huykman | 361/93 X |
| 4,530,023 | 7/1985 | Brown | 361/101 X |
| 4,581,551 | 4/1986 | Campbell, Jr. | 361/101 X |
| 4,651,252 | 3/1987 | Babinski | 361/87 X |
| 4,695,915 | 4/1987 | Mahalek et al. | 361/101 X |
| 4,750,079 | 6/1988 | Fay et al. | 361/101 |

FOREIGN PATENT DOCUMENTS

589273 6/1977 Switzerland .
213864A 10/1984 United Kingdom .

OTHER PUBLICATIONS

*Linear Circuit Techniques*—"5A Regulator with Thermal Gradient Controlled Current Limit" by Dobkin, IEEE, ISSCC 2/16/79.

Primary Examiner—Derek S. Jennings
Attorney, Agent, or Firm—Burns, Doane, Swecker & Mathis

[57] ABSTRACT

A device for protecting an integrated circuit against overload and short circuit currents. The integrated circuit functions such that it is alternatingly switched to an ON or an OFF state, and when in the ON state a supply current ($I_M$) is amplified by a Darlington-connected transistor step ($Q_{20}, Q_{21}$) and is supplied to the output (OUT) of the circuit across a load resistor ($R_{LOAD}$). For an OFF state of the integrated circuit no current is led to the output (OUT). A protective circuit (S) comprising a detection resistor ($R_{SENSE}$) is connected in series with said load resistance ($R_{LOAD}$). The protective circuit also includes a differential step (D) for sensing a voltaqge ($V_{SENSE}$) across the detection resistor (R hd SENSE) and a thyristor (T). Short circuit or overload on the output (OUT) causes an overcurrent to pass through said transistor step ($Q_{20}, Q_{21}$) and through the detection resistor. The increasing voltage ($V_{SENSE}$) across the detection resistor due to the overcurrent is sensed by the differential step (D) which thus energizes the thyristor (T) so that the supply current ($I_M$) is taken through the thyristor (T) instead of through the transistor step ($Q_{20}, Q_{21}$). The transitors ($Q_{20}, Q_{21}$) are thus pinched off, resulting in that the overcurrent is very quickly extinguished. The integrated circuit may be a final step in a semi-conductor relay, for example.

5 Claims, 3 Drawing Sheets

DEVICE FOR PROTECTING AN INTEGRATED CIRCUIT AGAINST OVERLOAD AND SHORT CIRCUIT CURRENTS

TECHNICAL FIELD

The invention relates to a device in integrated circuits for protecting the circuit against overload and short circuit currents. The circuit is intended for alternatingly switching current through a load on and off and may be such as a relay driver, a semiconductor relay or a power amplifier. The device in accordance with the invention comprises a protective circuit which is built into the circuit it is intended to protect.

BACKGROUND ART

It is already known to utilise certain types of overload protector in connection with integrated circuits.

DISCLOSURE OF INVENTION

One problem with the short circuit and overload protectors in the field today is that they have a long reaction time, i.e. the time it takes for the protector to attenuate an overload or short circuit current is too long. Short circuiting or overloading can occur on the output of the integrated circuit. An overcurrent thus flows through the integrated circuit during the reaction time of the protective circuit. When the output is short circuited, the overcurrent passes through the integrated circuit each time the circuit is switched on, and for a high switching frequency causes it to be destroyed or be given a shortened life, due to an excessive current passing through it for too long time. Another problem is that the integrated circuit together with the short circuit and overload protector oscillates when the protector is activated, such that the overcurrent alternatingly falls to zero, and then rises, which also results in that the circuit life is shortened.

The short circuit and overload protector which solves the mentioned problems in accordance with the invention, is characterized by the claims and comprises a detection resistor, a differential step and a thyristor.

If there is a short circuit or overload, the overcurrent passes a transistor step which is driven by a base current. The overcurrent also passes the detection resistor, whereon the differential step senses the overcurrent as a voltage increase and energises the thyristor so that the base current to the transistor step passes through the thyristor instead. The transistor step conducting the overcurrent is then pinched off so that the overcurrent is extinguished.

A short circuit protector with very short reaction time is obtained with the device in accordance with the invention. The integrated circuit can thus be used at switching frequencies up to 10 kHz without the risk of it being destroyed for a possible short circuit on the output. Due to the construction of the overload protector the occurence of the oscillations mentioned in connection with the prior art is prevented.

BRIEF DESCRIPTION OF DRAWINGS

The method and device in accordance with the invention will now be described in more detail, with the aid of an embodiment example and with reference to the accompanying drawing, on which

BEST MODE FOR CARRYING OUT THE INVENTION

According to the embodiment example, a device in accordance with the invention is included in the final step in a semiconductor relay. The device protects the final step against too high currents, which are caused by short circuiting or overload between the output of the final step and earth.

Figure 1:
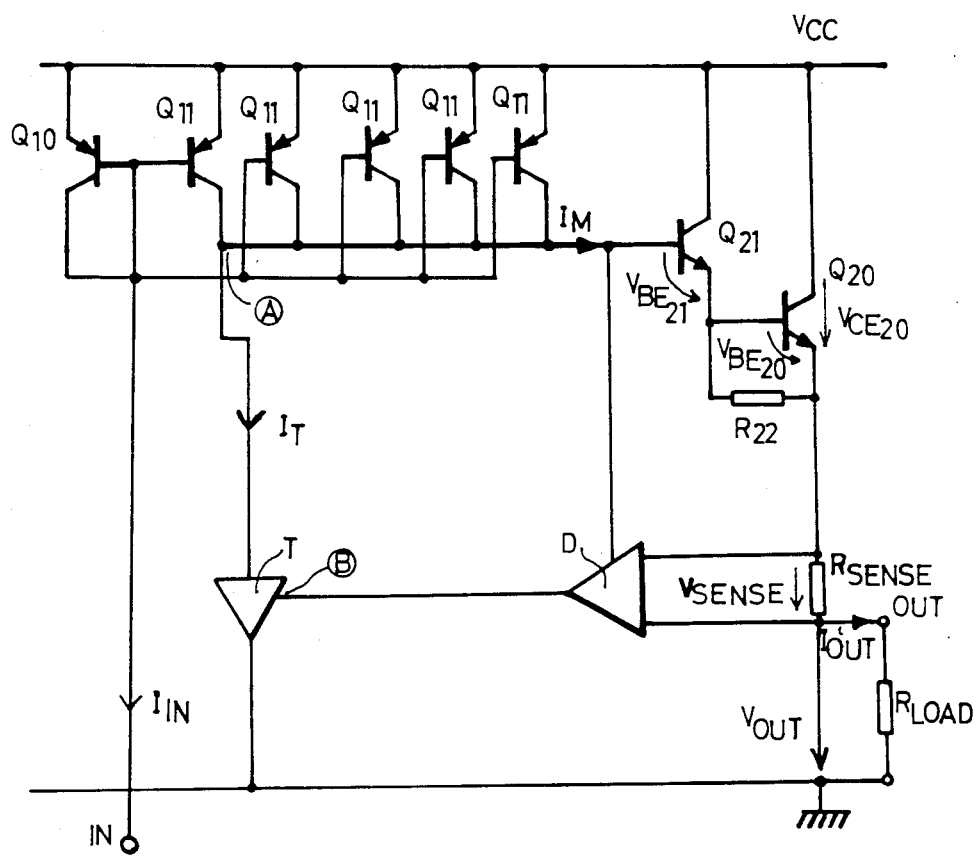
FIG. 1 illustrates the final step in a semiconductor relay with the protective circuit in a simplified form

FIG. 1 illustrates the final step of the semiconductor relay with a circuit D, T, $R_{SENSE}$ for the short circuit and overload protector, in the following denoted protective circuit S. The final step includes a current mirror $Q_{10}$, $Q_{11}$ and Darlington-connected power transistors $Q_{20}$, $Q_{21}$. The current mirror comprises a diode-connected bipolar transistor $Q_{10}$ of the PNP type, and of five mirrored, matched bipolar transistors $Q_{11}$ of the same type. The diode-connected transistor $Q_{10}$ has base and collector connected to a control input IN. The respective base of the five mirrored transistors $Q_{11}$ is connected to the base of the transistor $Q_{10}$. The collectors of the transistors $Q_{11}$ are connected to the base of an auxiliary transistor $Q_{21}$ of the NPN type in the Darligton pair. The emitter of the auxiliary transistor is connected to the base of a main transistor $Q_{20}$ in the pair. Between base and emitter on the main transistor $Q_{20}$ there is a resistor $R_{22}$ connected for increasing the extinguishing of current through the main transistor $Q_{20}$ for absence of base current to the auxiliary transistor $Q_{21}$. The emitter on the Darlington pair main transistor $Q_{20}$ is connected to one end of a detection resistor $R_{SENSE}$, connected for detecting overcurrents, the other end of the resistor being connected to the final step output OUT. A load resistor $R_{LOAD}$ is connected between the output OUT and earth. All transistors $Q_{10}$, $Q_{11}$ in the current mirror have their emitters connected to a supply voltage $V_{CC}$ and the two transistors $Q_{20}$, $Q_{21}$ in the Darlington pair have their collectors connected to the same supply voltage.

The function of the final step is described below with the aid of FIG. 1 and the signal diagram in FIG. 2. The final step is switched on or off alternatingly in response to whether the control input IN is energised or not. When the control input is energised, the final step is switched to an ON state and drives a current $I_{OUT}$ through the load resistor $R_{LOAD}$, and for an unenergised control input IN the final step is switched to an OFF state and no current is driven through the load resistor $R_{LOAD}$. An energised control input signifies that a current $I_{IN}$ is sent from the base on the transistors in the current mirror to the control input IN. An unenergised control input signifies that no current is sent from the current mirror to the control input. In accordance with the example, the control input IN is not energised at the time $t = t_0$ (see FIG. 2) and since current then cannot pass from the base on the transistors in the current mirror $Q_{10}$, $Q_{11}$ to the control input IN, all transistors in the final step are pinched off and the current $I_{OUT}$ through the load resistor $R_{LOAD}$ is equal to zero. At the time $t = t_1$ the control input is energised, the transistors $Q_{10}$, $Q_{11}$ in the current mirror then beginning to conduct. The collector currents through the transistors $Q_{11}$ in the current mirror form a supply current $I_M$ constituting base current to the auxiliary transistor $Q_{21}$ of the Darlington pair. The supply current $I_M$ is amplified in the Darlington pair and gives an output current $I_{OUT}$ through the load resistor $R_{LOAD}$. The output current $I_{OUT}$ may be 2 A, for example. At the time $t=t_2$ the control input IN is de-energised all transistors then being pinched off, and the output current $I_{OUT}$ falls to zero. Switching the current $I_{OUT}$ to the load resistor with an input current $I_{IN}$ on the control input is thus controlled so that the final step is switched to the ON state when the current $I_{OUT}$ is taken through the load resistor, and to the OFF state when no current is taken through the load resistor.

Figure 2:
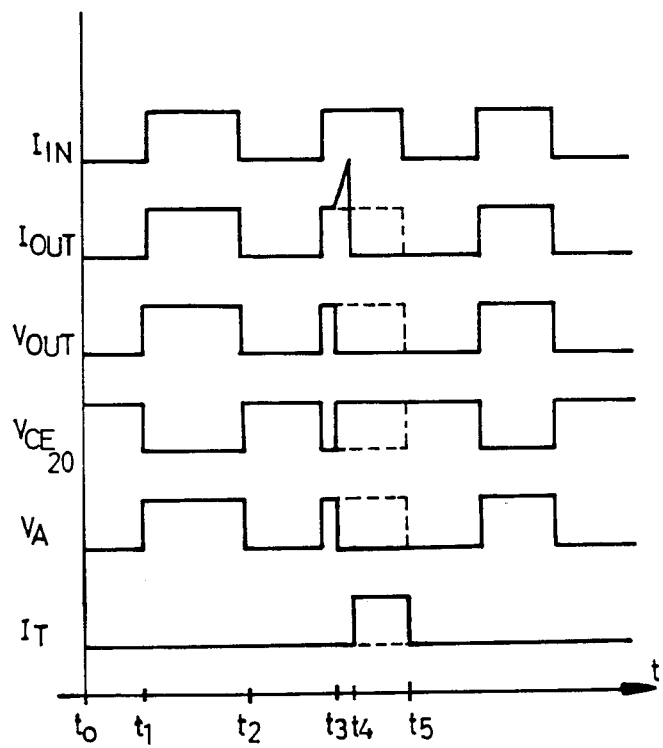
FIG. 2 illustrates a signal diagram for the final step with the protective circuit in normal drift and when there is a short circuit

The signal diagram in FIG. 2 also illustrates how some voltages in the circuit vary with the ON and OFF states of the final step. The output voltage $V_{OUT}$ across the load resistor $R_{LOAD}$ is equal to zero when the final step is OFF and equal to the supply voltage $V_{CC}$ minus the collector-emitter voltage $V_{CE20}$ when the final step in ON. The voltage drop across the detection resistor $R_{SENSE}$ is negligible in relation to the above-mentioned voltages. With the final step ON, i.e. when the transistor $Q_{20}$ is conductive, the voltage drop $V_{CE20}$ is about 2 V, which is illustrated in the signal diagram by a low signal and when the final step is OFF i.e. when the transistor is pinched off, the voltage drop $V_{CE20}$ is equal to the supply voltage $V_{CC}$, which is illustrated by a high signal in the signal diagram. The potential difference $V_A$ between the collectors of the mirrored transistors $Q_{11}$, i.e. the point A (see FIG. 1), and earth is equal to the output voltage $V_{OUT}$ plus the base-emitter voltages $V_{BE20}$, $V_{BE21}$ in the Darlington pair. For normal operation a final step in the ON state thus signifies that the potential difference $V_A$ is high while in the OFF state the potential difference is low.

As already mentioned, a protective circuit is built into the final step to protect it against short circuit and overload currents which can occur on its output. This protective circuit is the inventive subject. Short circuiting is caused by direct contact between the output OUT and earth, and overloading is caused by the load resistance decreasing and becoming lower than a given lower limit. The protective circuit is shown in a simplified form in FIG. 1 and includes the detection resistor $R_{SENSE}$, for detecting current alterations on the output OUT of the final step; a differential step D, which has a first and a second input connected to either side of the detection resistor for sensing the voltage $V_{SENSE}$ across the resistor; and an output B connected to a thyristor T, which is energised by the differential step for overload or short circuit. The thyristor T has a first connection to the collectors on the mirrored transistors $Q_{11}$ in the current mirror and a second connection to earth, such that for overload or short circuit the supply current $I_M$ can be taken through the thyristor instead of through the Darlington pair $Q_{20}$, $Q_{21}$. In order to describe how the protective circuit functions, it is assumed that there is a short circuit between the output OUT and earth when the final step is ON. According to the example, the short circuit occurs at the time $t=t_3$, see signal diagram in FIG. 2, the output voltage $V_{OUT}$ then falling to zero. Since the voltage drop across the detection resistor $R_{SENSE}$ is negligible in relation to the supply voltage $V_{CC}$, the whole of the supply voltage $V_{CC}$ is obtained across the collector-emitter of the main transistor $Q_{20}$ in the Darlington pair, which is illustrated in the signal diagram by the collector-emitter voltage $V_{CE20}$ across the main transistor $Q_{20}$ becoming high.

The short circuit then causes a short circuiting current to pass through the transistor $Q_{20}$ and the dectection resistor $R_{SENSE}$. The short circuiting current is shown in the signal diagram as a growing output current $I_{OUT}$. The differential step D senses the short circuiting current as an increasing voltage $V_{SENSE}$ across the detection resistor $R_{SENSE}$ and energises the thyristor T so that it becomes conductive. By the thyristor becoming conductive the supply current $I_M$ from the current mirror $Q_{10}$, $Q_{11}$ changes path and passes through the thyristor T to earth instead of through the Darlington pair $Q_{20}$ $Q_{21}$, since the resistance through the conductive thyristor is lower than the resistance through the Darlington pair. The supply of base current to the Darlington transistors $Q_{20}$, $Q_{21}$ consequently ceases, these then being pinched off and unable to conduct current. The short circuiting current is thus extinguished, which takes place at the time $t=t_4$, according to the example. At the short circuit the voltage between the point A (FIG. 1) and earth falls to less then 1 V, which corresponds to the biasing voltage drop of the thyristor when it is conductive. After engergising, at the time $t=t_4$, the thyristor conducts current $I_T$ as long as the control input IN is energised. The thyristor stops conducting current the first time the control input is de-energised after the short circuit has occured. According to the example this takes place at the time $t=t_5$. If the short circuit does not remain when the control input IN is energised the next time, the final step functions normally again, which is shown in the signal diagram. On the other hand, if the short circuit remains the next time the control input IN is energised, a short circuiting current is once again obtained through the main transistor $Q_{20}$ of the Darlington pair, which is detected by the detection resistor so that the differential step energises the thyristor anew enabling the short circuiting current to fall to zero. The dashed curves in the signal diagram represent the signals when a short circuit does not occur.

Figure 3:
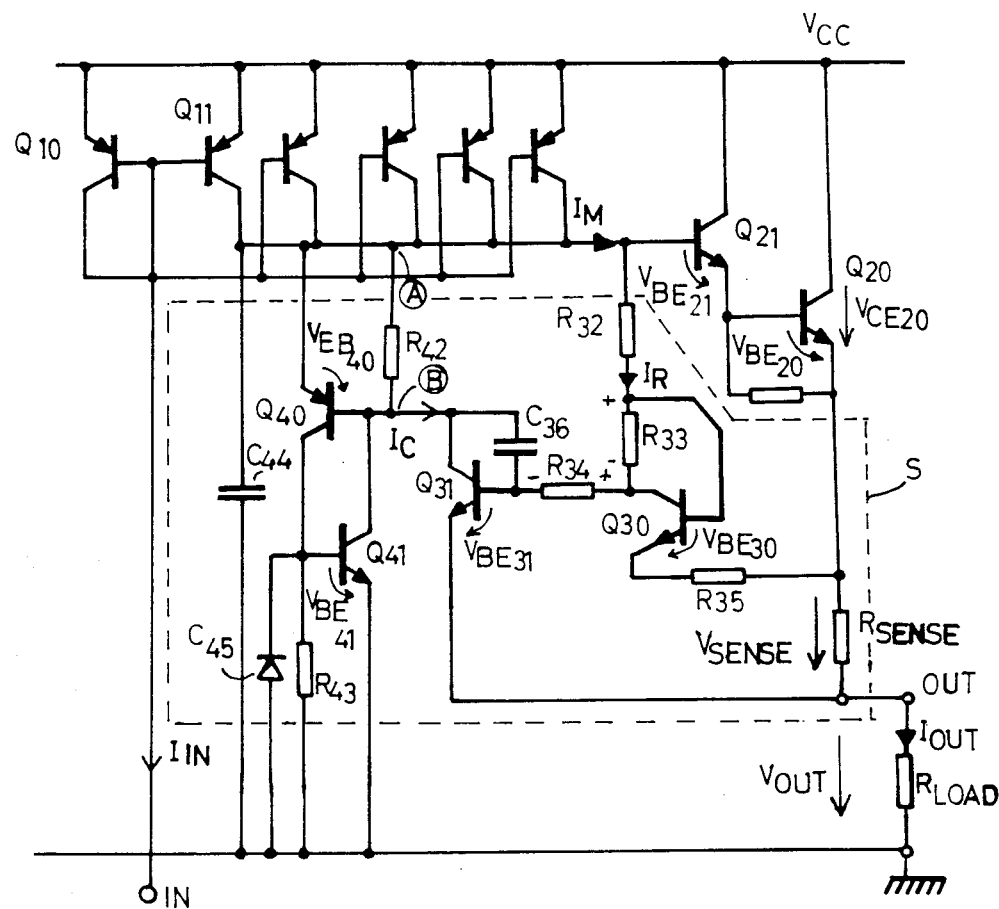
FIG. 3 illustrates the final step with the protective circuit in a more detailed form.

FIG. 3 illustrates the final step with a more detailed depiction of the protective circuit S. The differential step mainly includes two NPN bipolar transistors, a first transistor $Q_{30}$ and a second transistor $Q_{31}$. The thyristor primarily comprises two bipolar transistors, a pilot transistor $Q_{40}$ of the PNP type and an ignition transistor $Q_{41}$ of the NPN type. The protective circuit is shut off, i.e. without current, when the final step is OFF and it works in a ready state when the final step is ON and there is no short circuit or overload on the output. In the ready state the protective circuit is ready for quickly protecting the final step if a short circuit or overload occurs on its output.

In the ready state the two transistors $Q_{30}$, $Q_{31}$ in the differential step are made conductive by a constant current $I_R$ being taken through a current restricting resistor $R_{32}$ to them. The current $I_R$ is determined by the size of the resistor $R_{32}$, by the base-emitter voltages $V_{BE21}$, $V_{BE20}$ in the Darlington pair and by the base-emitter voltage $V_{BE30}$ in the first transistor $Q_{30}$ of the differential step $(R_{32} \times I_R = V_{BE21} + V_{BE20} - V_{BE30})$. The voltage drop across an emitter resistor $R_{35}$ is negligible in relation to these voltages. The current $I_R$ delivers base current to the first transistor $Q_{30}$ and collector current, via a collector resistor $R_{33}$, to said transistor and thus determines the base-emitter voltage $V_{BE30}$. Base current also flows through the collector resistor $R_{33}$ to the second transistor $Q_{31}$, this base current also passing a resistor $R_{34}$ intended for stabilising said base current. The base-emitter voltage $V_{BE31}$ on the second transistor $Q_{31}$ in the differential step is determined by the base-emitter voltage $V_{BE30}$, the voltage drop across the emitter resistor $R_{35}$, the voltage drop across the collector resistor $R_{33}$ and by the voltage drop $V_{SENSE}$ across the detection resistor $R_{SENSE}$, this voltage drop varying with the current through said detection resistor ($V_{BE31} = V_{BE30} + V_{R35} - V_{R33} + V_{SENSE}$). The voltage drop across the stabilising reistor $R_{34}$ is negligible. The collector current $I_C$ to the second transistor $Q_{31}$ of the differential step is determined by the base-emitter voltage $V_{BE31}$ of the transistor $Q_{31}$. By suitable component selection the second transistor $Q_{31}$ is given a base-emitter voltage $V_{BE31}$ in the ready state, this voltage being of a magnitude such that its collector current $I_C$, when the latter passes a first resistor $R_{42}$ in the thyristor, gives the pilot transistor $Q_{40}$ an input voltage which is the emitter-base voltage $V_{EB40}$, the magnitude of which falls below the value at which the pilot transistor $Q_{40}$ is energised so that the transistor $Q_{40}$ is not given full energising voltage in the ready state, but is given an input voltage of a magnitude such that even a small increase thereof makes it capable of energising the transistor. From what has been said above it will be apparent that even a small increase of the voltage $V_{SENSE}$ increases the input voltage of the pilot transistor $Q_{40}$ so that it is energised. The collector resistor $R_{33}$ compensates the temperature sensisitvity of the detection resistor $R_{SENSE}$. The value of the emitter resistor $R_{35}$ is selected such that the value of the detection resistor $R_{SENSE}$ can be kept very low.

In accordance with the example, a short circuit occurs between the output OUT and earth at the time $t = t_3$ in the signal diagram in FIG. 2. As previously mentioned, the supply voltage $V_{CC}$ is obtained across the collector-emitter on the Darlington pair main transistor $Q_{20}$, a short circuiting current thus passing said transistor and through the detection resistor $R_{SENSE}$. Due to the short current, the voltage $V_{SENSE}$ increases over the detection resistor which, as previously described increases the base-emitter voltage $V_{BE31}$ on the second transistor $Q_{31}$ of the differential step ($V_{BE31} = V_{BE30} + V_{35} - V_{R33} + V_{SENSE}$) the protective circuit then being energised, as well as the thyristor. The collector current $I_C$ through the transistor $Q_{31}$ increases and passes the first resistor $R_{42}$ in the thyristor so that the emitter-base voltage $V_{EB40}$ on the pilot transistor $Q_{40}$ of the thyristor rapidly increases to energising level, causing this transistor to be energised. A current passing a second resistor $R_{43}$ in the thyristor then flows through the pilot transistor, whereby the base-emitter voltage $V_{BE41}$ of the ignition transistor $Q_{41}$ increases so that the ignition transistor $Q_{41}$ is energised, thus leading the entire supply current $I_M$ out from the current mirror $Q_{10}$–$Q_{11}$ through the thyristor instead of through the Darlington pair. The thyristor is thus energised and the protective circuit is working in an active state, which occurs at the time $t = t_4$. After the thyristor has been energised, the transistors in the Darlington pair $Q_{20}$, $Q_{21}$ are not supplied with base current which results in that they are pinched off and cease to conduct, the short circuiting current then falling to zero. The main transistor $Q_{20}$ of the Darlington pair is thus protected from being destroyed by the short circuiting current. The protective circuit works in an active state until the final step is switched off, which prevents the occurence of the oscillations, previously mentioned in connection with the prior art.

For accelerating energising of the thyristor when there is a short circuit, a capacitor $C_{36}$ (a Miller capacitor) is connected between collector and base on the second transistor $Q_{31}$ of the differential step. For a short circuit the voltage between collector and base is altered on the second transistor $Q_{31}$ of the differential step, the capacitor $C_{36}$ then supplying current to the base on the transistor $Q_{31}$, which immediately answers by drawing more collector current $I_C$ through the first resistor $R_{42}$ of the thyristor. The pilot transistor $Q_{40}$ then rapidly receives suffiently great emitter-base voltage (input voltage $V_{EB40}$ for becoming engerised. Energising the thyristor then continues according to the previous description. The capacitor $C_{36}$ thus allows very rapid increase of the collector current $I_C$ to the second transistor $Q_{31}$ of the differential step, resulting in that the thyristor is energised in a maximum time of 5 ps, i.e. short circuit protection is triggered within this time.

The protective circuit in accordance with the invention thus has a very short reaction time, thanks to this construction, which results in that the short circuiting current ceases before the main transistor $Q_{20}$ of the Darlington pair is damaged. The problem with long reaction time in the protective circuits known today is thus dispensed with. The final step with the protective circuit in accordance with the example can, thanks to the short reaction time, be given a switch frequency up to 10 kHz without risking that the life of the final step is affected negatively for a possible short circuit on its output.

The thyristor is heavily dependent on temperature, and its energising reliability decreases at low temperatures. For the thyristor to have high engergising reliability within a wide temperature range, the second resistor $R_{43}$ has a high resistance value so that the current required through the resistor for energising the thyristor will be low. A high value for the resistor $R_{43}$ increases the sensitivity of the thyristor to current transients, however, and thereby increases the risk of the thyristor being energised incorrectly, e.g. by the current transients occuring due to the transistors $Q_{31}$, $Q_{40}$, $Q_{41}$ containing capacitances to earth. The final step connects current to and from a load, whereby the thyristor is subjected to a voltage derivative $dV_A/dt$. For a high voltage derivative the mentioned capacitancies cause capacitive currents, i.e. current transients, which pass through the first resistor $R_{42}$ of the thyristor, bringing with it the risk that the thyristor can energise itself. By connecting a capacitor $C_{44}$ of about 10 pF in parallel with the thyristor, the voltage derivative $dV_A/dt$, and thereby the current transients, are reduced, thus eliminating the risk of self energising.

To avoid incorrect energising of the thyristor for short voltage fluctuations on the output OUT of the final step, a small capacitor $C_{45}$ which according to the example consists of the PN junction in a diode, is connected between base and emitter on the ignition transistor $Q_{41}$. Short voltage fluctuations on the output can cause current transients through the pilot transistor $Q_{40}$, these transients energising the the thyristor in the same way as a short circuit. The capacitor $C_{45}$ shortcircuits the current transients to prevent them passing through the second resistor $R_{43}$ and thereby energising the thyristor by energising the ignition transistor $Q_{41}$.

As previously mentioned, the protective circuit protects the final step against high currents occuring due to overloading as well. The shutting off process for overcurrents takes place in the same way as for short circuiting, but with the difference that if the overloading process is relatively slow the capacitor $C_{36}$ does not supply current to the base of the transistor $Q_{31}$. In the example the overcurrent is interrupted by the thyristor being energised when the current is about 3, 5 A.

I claim:

1. Device comprising a protective circuit for protecting an integrated circuit against overload and short circuit currents, the integrated circuit containing, apart from the protective circuit, a first transistor step connected to a second transistor step, a control input, an output and a load resistor connected between said output and earth, the control input controlling the integrated circuit so that it is alternatingly switched on or off, in an ON state a supply current in the circuit being amplified by said second transistor step and delivered to the output of the circuit across the load resistor and no current being taken to the output for an OFF state in the circuit, said protective circuit comprising a detection resistor, connected in series with said load resistor; a differential step for sensing a voltage drop across the detection resistor, said differential step having a first input connected to a first side of the detection resistor and a second input connected to an other side of the detection resistor, and an output connected to a thyristor including a pilot transistor and an ignition transistor, said thyristor having a first connection to the collector on said first transistor step and a second connection to earth, the differential step energising the thyristor when the protective circuit is activated, such that for an integrated circuit in the ON state said protective circuit assumes a ready state in which the input voltage to the pilot transistor falls below the voltage level at which the transistor is energised, such that the protective circuit is activated for overload or short circuit on the output of said circuit, the input voltage to the pilot transistor of the thyristor then exceeding the energising voltage level of the transistor so that the transistor is energised, whereby the protective circuit goes into an active state in which said current is taken through the thyristor instead of through said second transistor step, which is thus pinched off, and the overload or short circuit current is extinguished, and such that the protective circuit works in an active state until the integrated circuit is switched off.

2. Device as claimed in claim 1, further comprising a Miller capacitor connected to the second transistor of the differential step for rapid activation of the protective circuit if there is a short circuit.

3. Device as claimed in claim 1, further comprising a capacitor connected in parallel with the thyristor for preventing incorrect energising of the thyristor by reducing current transients.

4. Device as claimed in claim 1, further comprising a capacitor connected between base of said ignition transistor and earth, for preventing incorrect energising of the thyristor by short circuiting current transients.

5. Device as claimed in claim 1, wherein said differential step comprises a first transistor connected to said first input and second transistor connected to said second input, said first and second transistors thus being connected through said detection resistor.

* * * * *